United States Patent [19]
Uchida et al.

[11] Patent Number: 5,467,304
[45] Date of Patent: Nov. 14, 1995

[54] SEMICONDUCTOR INTEGRATED CIRCUIT

[75] Inventors: Katsunori Uchida; Shotaro Kobayashi; Tatsuhiro Fukushima, all of Tokyo, Japan

[73] Assignee: NEC Corporation, Tokyo, Japan

[21] Appl. No.: 340,293

[22] Filed: Nov. 14, 1994

[30]        Foreign Application Priority Data

Nov. 17, 1993   [JP]   Japan .................................. 5-311307
Jun. 1, 1994    [JP]   Japan .................................. 6-119931

[51] Int. Cl.$^6$ .................................................. G11C 7/00
[52] U.S. Cl. ................. 365/174; 365/225.7; 365/189.12; 365/96; 365/189.02; 365/230.02
[58] Field of Search .......................... 365/94, 96, 189.01, 365/189.02, 230.02, 189.12, 225.7, 174

[56]            References Cited
              U.S. PATENT DOCUMENTS 4,419,747  12/1983  Jordan ........................................ 365/96
4,905,198   2/1990  Oishi et al. ............................. 365/225.7
4,916,662   4/1990  Mizuta ..................................... 365/189.06
5,255,226  10/1993  Ohno et al. ............................ 365/189.12
5,325,323   6/1994  Nizaka ........................................ 365/96

*Primary Examiner*—David C. Nelms
*Assistant Examiner*—Vu A. Le
*Attorney, Agent, or Firm*—Whitham, Curtis, Whitham & McGinn

[57]                ABSTRACT

A semiconductor integrated circuit has an identification code indicative of the classification of the product given at or after an assembling process. The semiconductor integrated circuit also includes a identification code outputting portion for outputting the identification code corresponding to an input signal set and input after assembling.

10 Claims, 12 Drawing Sheets

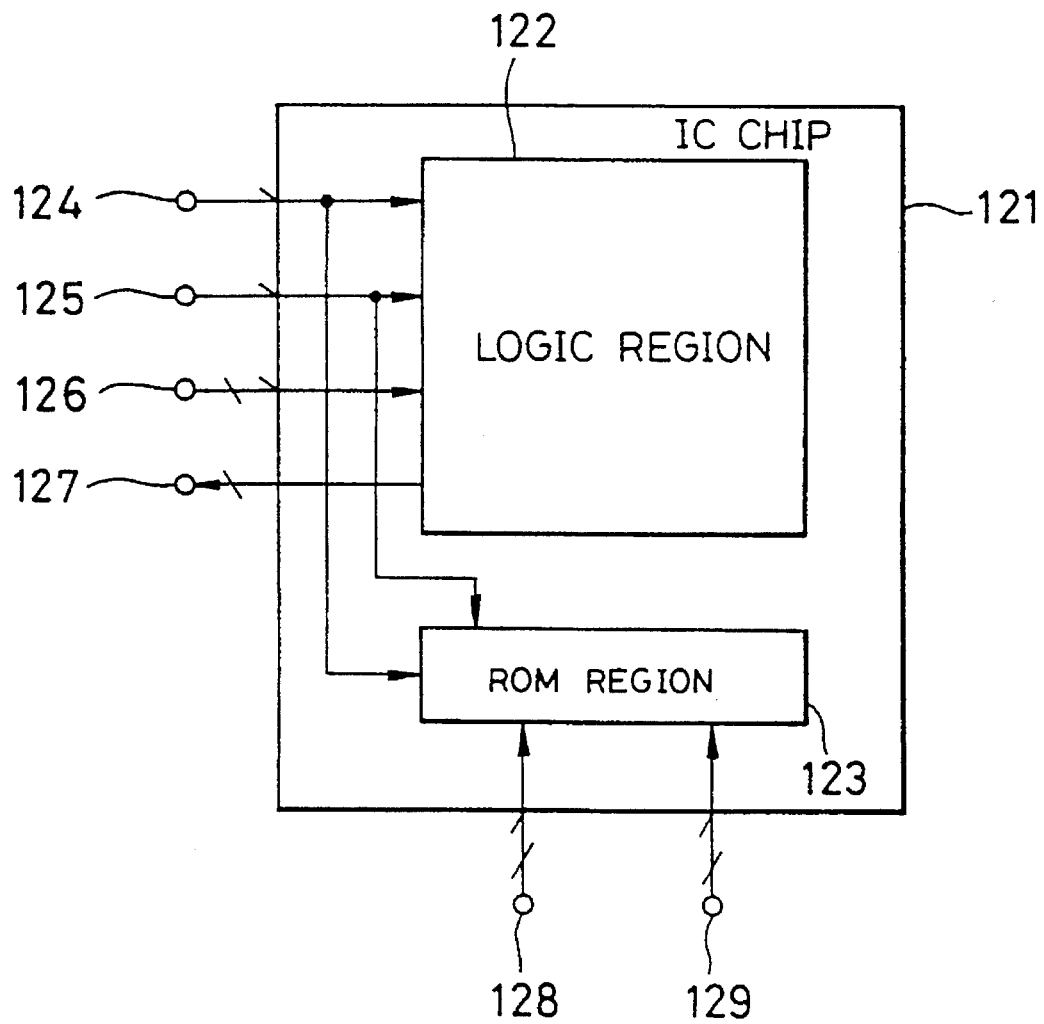

SEMICONDUCTOR INTEGRATED CIRCUIT

BACKGROUND OF THE INVENTION

1. Field of the Invention

The present invention relates generally to a semiconductor integrated circuit. More specifically, the invention relates to a semiconductor integrated circuit for performing code setting of kind identification and so forth.

2. Description of the Related Art

A conventional semiconductor circuit typically comprises ID code registers 22 to 25, a setting portion for setting codes, such as kind identification codes and so forth by multiplexers 26 to 28 and an output portion, as shown in FIG. 8. In the shown example, an identification code is expressed by 4 bits. Here, discussion will be given for the case where the identification code is "1010".

The example shown in FIG. 8, in order to avoid increasing of the ID code outputting terminals, is designed in a form of a kind of a shift register for outputting the ID code from an ID code outputting pad 29 per one bit in a serial manner.

The ID code registers 22 to 25 are constructed by D-flip-flops so as to output the level of D-terminal input to Q-terminal at rising of a shift clock from a shift clock pad 21.

The multiplexers 26 to 28 output the level of A-terminal to O-terminal when the S-terminal is high level. On the other hand, the multiplexers 26 to 28 output a level of B-terminal to the O-terminal when the S-terminal is low level. Here, A-terminal is connected to a power supply line Vcc or grounding line GND depending upon the ID code of the kind.

Respective B-terminals of the multiplexers 26 to 28 are connected to Q-terminal outputs of respective ID code registers 22 to 24. Also, O-terminal outputs of respective multiplexers 26 to 28 are connected to D-terminals of respective ID code registers 23 to 25.

From the semiconductor integrated circuit, in which the setting portion for setting the code and the output portion are constructed as set forth above, ID code is output through the operation illustrated in FIG. 9. In such a case, at first, an identification code setting signal from the identification code setting signal pad 30 is turned into high level to switch the shift clock from the shift clock pad 21 into high level.

Next, the identification code setting signal from the identification code setting signal pad 30 is turned into low level to input a shift clock to the shift clock pad 21. Then, low level, high level, low level, and high level are sequentially output from an ID code outputting pad 29.

Here, if it is set to output the ID code from the ID code outputting pad 29 in the order from the least significant bit (LSB) to the most significant bit (MSB), the code "1010" can be output.

On the other hand, as shown in FIG. 10, as a semiconductor integrated circuit having built-in means for obtaining kind code of the chip in the IC chip 91 per se, there is a master slice type semiconductor integrated circuit. In this type of semiconductor integrated circuit, the identification code is set in the ROM 94 in the IC chip 91.

Here, on the IC chip 91, a function circuit portion 92 is installed. For the function circuit portion 92, a plurality of function circuit pads 99 are provided. For an address counter 93 supplying an address to ROM 94, a power source pad 95 and a counter incrementing pad 96 are provided. To the ROM 94, an output pad 97 and a grounding pad 98 are connected.

When the kind of chip is varied, the content of the ROM 94 is vat led in a wiring step in a diffusion process. When the identification code is output from the ROM 94, addresses are generated in order from the counter 93. With this address, the information read out from the ROM 94 is output to the outputting pad 97.

The above-mentioned semiconductor integrated circuit has been disclosed in detail in Japanese Unexamined Patent Publication (Kokai) No. Heisei 1-100943.

Other than the above-mentioned semiconductor integrated circuit, there is an IC chip 111 incorporating means for obtaining the kind of code of the chip per se, as illustrated in FIG. 11. In this example, nine resistors 113 having resistance of 100Ω are connected in series and ten taps 114 are extended from both ends of respective resistors 113.

In order to externally extend four taps among ten taps, bonding pads 115 to 118 are provided. It should be noted that function circuit portion 112 is installed on the IC chip 111 and a plurality of function circuit pads 119 are connected to the function circuit portion 112.

Among the bonding pads 115 to 118, the bonding pads 116 and 117 are used for establishing the identification code of the product name of the IC-chip per se. Namely, depending upon the connection of these bonding pads to the ten of taps, ID code can be differentiated.

On the other hand, as shown FIG. 12, in there is an IC chip 121 a incorporating a ROM as means for obtaining the kind code of the chip per se. In this example, in addition to a logic region 122 for performing normal signal processing and arithmetic operation, ROM region 123 is provided.

In the ROM region 123, information, such as kind name, mask name employed for fabrication of the IC and so forth written in a form of code, for setting optimal test program corresponding to a testing system when the IC chip is tested.

ROM region 123 is connected to a terminal 124 for applying a power source voltage Vcc and a terminal 125 connected to the grounding line GND similarly to the logic region 122. Also, input port 126, an output port 127, an address port 128 and a data port 129 are provided for the ROM region 123.

When the IC chip constructed as set forth above is tested, once the IC chip 121 is set in an LSI test system (not shown) as the objective IC for measurement, an information for selecting the test program written in the ROM region 123 is input to the address port 128.

When the address port 128 is accessed for inputting such information, the information stored in the ROM region 123 is read out and supplied to the LSI test system via the data bus 129. The LSI test system makes judgement for the information read out from the ROM region 123 and executes an IC test program corresponding to the read out information.

The semiconductor integrated circuit shown in FIG. 12 has been disclosed in detail in Japanese Unexamined Patent Publication (Kokai) No. Showa 62-51234.

As set forth above, in the conventional semiconductor integrated circuit, setting of the kind code is performed at the diffusion process or writing in to the ROM. Therefore, particularly in the case where the kind identification code is set in the diffusion process, it becomes impossible to set the kind identification code for the kind, such as bonding option parts whose kind name is determined only at the assembling process. Also, in writing of the identification code to the ROM by a program, it is possible that the identification code is erased by re-writing of the program.

Here, the bonding option parts are a plurality of kinds of semiconductor integrated circuit having the common basic function and only part of functions are differentiated slightly.

In such a kind of semiconductor integrated circuit, the basic function, all of the circuit for specific functions owned by each kind, a plurality of bonding pads for kind classification provided separately from the bonding pads of the terminal present in the specification of the product, and a circuit 3 for making judgement whether a plurality of bonding pads for kind classification are connected to the Vcc level or GND level, are installed on the chip.

In the above-mentioned bonding option parts, only one master pattern is diffused in the diffusion process, and the kind is determined by selectively bonding respective bonding pads to Vcc pin or GND pin corresponding to the desired kind of operation during the assembling process.

An advantage of the above-mentioned bonding option parts is that, since the master pattern in the diffusion process is only one kind, after performing all steps in the diffusion process, the kind can be determined upon assembling process depending upon demand, period for fabrication can be shortened.

However, in the conventional semiconductor integrated circuit, since the identification code is set per kinds in the diffusion process, it cannot handle setting of the identification code for the bonding option parts, the kind of which are determined upon assembling process.

Also, even in setting of the identification code for the derivative produced and so forth, for which grade of the wafer is determined by P/W (pellet/wafer) selection after the diffusion process, the conventional code setting cannot be effectively made since different identification codes have to be given per grade of the wafer during the assembling process.

Particularly, when the semiconductor integrated circuit is the bonding option parts or derivative parts or so forth, and contains a boundary scanning test circuit according to IEEE 1149.1, the foregoing problem becomes serious.

The boundary scanning test circuit is a dedicated circuit installed on the semiconductor integrated circuit for testing the board of the device. One of the tests to be performed by such boundary scanning test circuit is to make the identification code of the semiconductor device to be output.

In such the case, the ID code must correspond to the kind name on a one to one basis according to the provision under IEEE standard. Accordingly, the kind, such as the bonding option parts or derivative parts, the kinds of which are classified and determined during the assembling process, it cannot be adapted to the semiconductor integrated circuit installing the boundary scanning test circuit.

SUMMARY OF THE INVENTION

It is an object of the present invention to provide a semiconductor integrated circuit which can set the identification code corresponding to the kind even when the kind is modified during the assembling process.

According to one aspect of the invention, a semiconductor integrated circuit comprises a plurality of bonding pads, each bonding pad supplied with a voltage for setting an identification code indicative a kind of the semiconductor integrated circuit, judgement means for making judgement for a combination pattern of voltage levels of the bonding pads, holding means for holding a result of the judgement by the judgement means as the identification code, wherein each of the bonding pads is bonded to a predetermined voltage line corresponding to the kind of said semiconductor integrated circuit.

According to another aspect of the invention, a semiconductor integrated circuit comprises plurality of fuse circuits for generating voltage for setting an identification code indicative a kind of the semiconductor integrated circuit, judgement means for making judgement for a combination pattern of voltage levels generated by the fuse circuits, holding means for holding a result of said judgement by the judgement means as the identification code, wherein fuses in the fuse circuits are selectively cut corresponding to the kind of the semiconductor integrated circuit.

BRIEF DESCRIPTION OF THE DRAWINGS

The present invention will be understood more fully from the detailed description given herebelow and from the accompanying drawings of the preferred embodiment of the invention, which, however, should not be taken to be limitative to the present invention, but are for explanation and understanding only.

In the drawings:

FIG. 12 is an illustration showing the construction of the prior art;

DESCRIPTION OF THE PREFERRED EMBODIMENTS

The present invention will be discussed hereinafter in terms of the preferred embodiments illustrated in FIGS. 1 to 7. In the following description, numerous specific details are set forth in order to provide a thorough understanding of the present invention. It will be obvious, however, to those skilled in the art that the present invention may be practiced without these specific details. In other instance, well-known structures are not shown in detail in order to unnecessary obscure the present invention.

Figure 1:
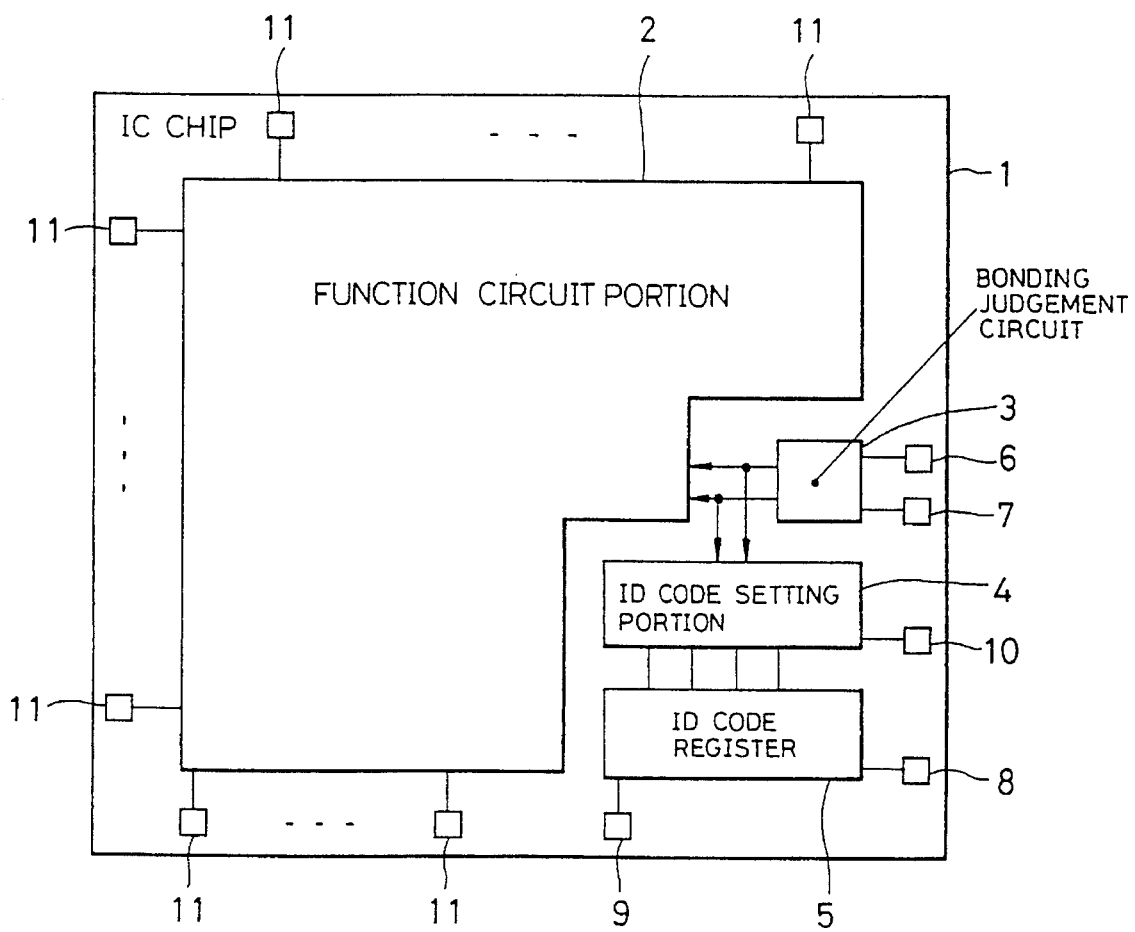
FIG. 1 is an illustration showing one embodiment of a semiconductor integrated circuit according to the present invention.

In FIG. 1, on an IC chip 1, a function circuit portion 2, a bonding judgement portion 3, an ID setting portion 4 and an ID register 5 are installed.

The function circuit portion 2 has common basic function and circuits for four kinds which are differentiated from each other in a part of function, and is connected to a plurality of function circuit pads 11. Also, the function circuit portion 2 is defined to make one of the four kinds of circuits depending upon whether the bonding option pads 6 and 7 are bonded to the GND pin.

The bonding judgement portion 3 outputs low level when the bonding option pads 6 and 7 are bonded to the GND pins upon on-set of power supply for the IC chip 1 and otherwise outputs high level, to the function circuit portion 2 and the ID code setting portion 4, respectively. The ID code setting portion is connected to the ID code setting pad 10 and selects one of ID codes among four kinds depending upon the level of the output of the bonding judgement portion 3.

The ID code register 5 comprises a shift register consisted of D-flipflops, a number of which corresponds to a number of bits of the ID code selected by the ID code setting portion 4. For the ID code register 5, an ID code outputting pad 8 and a shift clock pad 9 for supplying a shift clock are provided.

Figure 2:
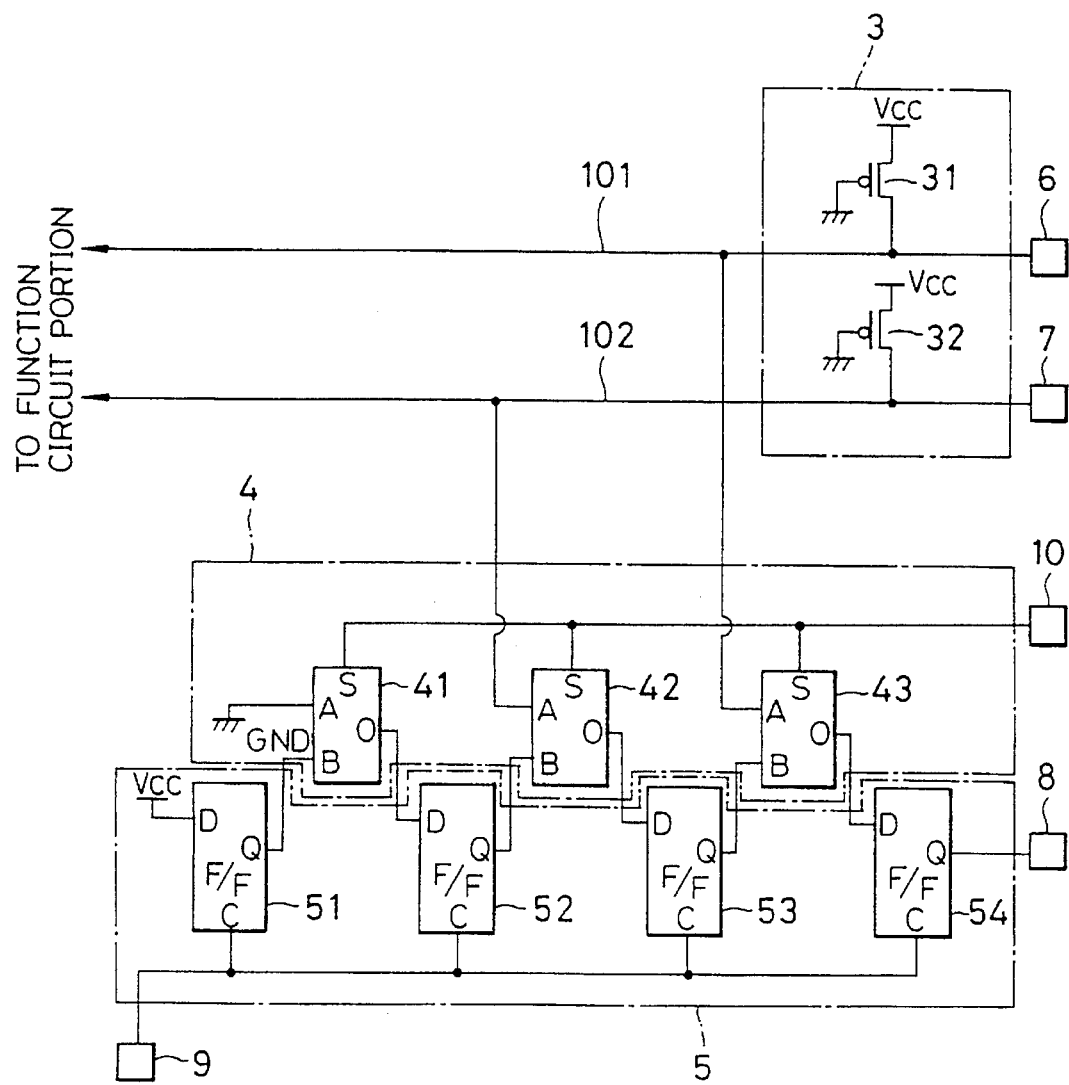
FIG. 2 is an illustration showing a detailed and concrete example of a bonding judgement portion, an ID code setting portion and ID code register in the semiconductor integrated circuit.

FIG. 2 is an illustration showing the practical detail of the bonding judgement portion 3, the ID code setting portion 4 and the ID code register 5. In the embodiment shown in FIG. 2, depending upon the bonding option, one IC chip is classified into four kinds in the assembling step. For respective of classified four kinds, mutually distinct ID codes (4 bits in the shown case) are set.

In FIG. 2, the bonding judgement portion 3 comprises P-channel transistors 31 and 32. P-channel transistors 31 and 32 are set at small current capacity so that they may serve as pull-up resistance for the signal lines 101 and 102 from the bonding option pads 6 and 7 to the function circuit portion and the ID setting portion by connecting the gates thereof to the GND level.

The ID code setting portion 4 comprises multiplexers 41 to 43. The multiplexers 41 to 43 are adapted to output the level of the A-terminal to the O-terminal when the signal from the ID code setting pad 10 to the S-terminal is high level and output the level of B-terminal to the O-terminal when the signal to the S-terminal is low level, Here, the A-terminals of the multiplexers 41 to 43 are selectively connected to the power source line Vcc and the grounding line GND depending upon the ID code of the kind. Also, the B-terminal is connected to respective Q-terminal output of D-flipflops (hereinafter referred to as "F/F") 51 to 53 of the ID code register 5.

The ID code register 5 comprises the F/F 51 to 54 which are adapted to output the level of the D-terminal input to the Q-terminal at rising of the shift clock from the shift clock pad 9. It should be noted that to the ID code output pad 8, the Q-terminal of the final stage F/F 54 of the ID code register 5 is connected.

Figure 3:
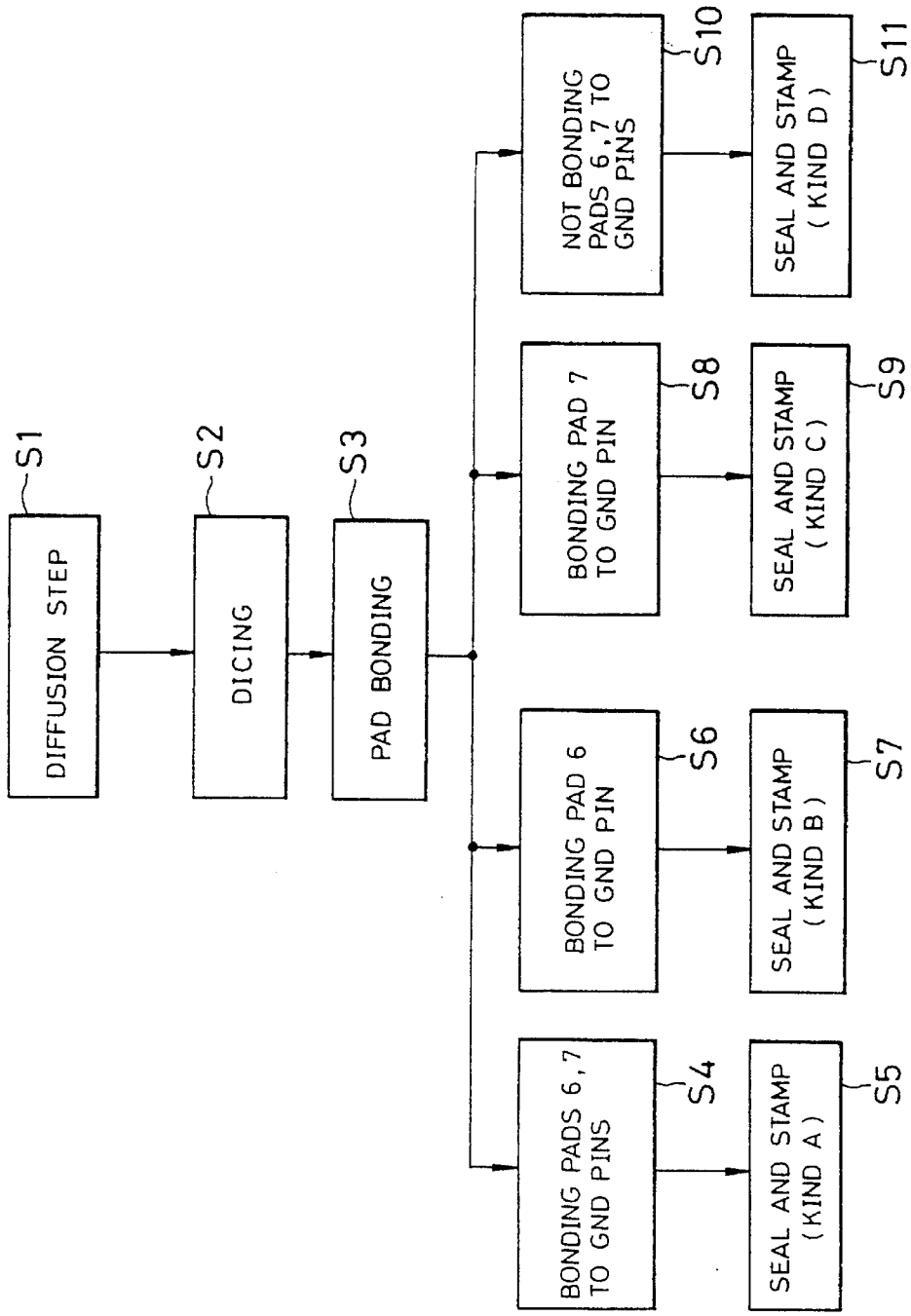
FIG. 3 is an illustration showing a fabrication process of one embodiment of the semiconductor integrated circuit according to the invention.

FIG. 3 is an illustration showing a fabrication process of one embodiment of the semiconductor integrated circuit according to the invention. In FIG. 3, all steps in the diffusion process are performed with one kind of mask pattern (step S1 of FIG. 3), separating the IC chip 1 from the wafer in the step of dicing (step S2 of FIG. 3). For the separated IC chip 1, a plurality of function circuit portion pads 11 are bonded (step 3 of FIG. 3).

Normally, the bonding option parts have a common basic function, the ID codes for the four kinds are set to have common upper bits and different lower bits.

For instance, in the diffusion process, the ID code becomes "10XX" In this ID code, X is "0" or "1" which is determined whether the bonding option pads 6 and 7 are bonded to the GND pins or not.

When the bonding opt ion pads 6 and 7 are both bonded to the GND pins (step S4 of FIG. 3), the IC chip becomes a kind A (step S5 of FIG. 3) and then the ID code becomes "1000".

On the other hand, when only bonding option pad 6 is bonded to the GND pin (step S6 of FIG. 3), IC chip becomes a kind B (step S7 of FIG. 3) and then the ID code becomes "1010".

Also, when only bonding option pad 7 is bonded to the GND pin (step S8 of FIG. 3), IC chip becomes a kind C (step S9 of FIG. 3) and then the ID code becomes "1001".

When the bonding option pads 6 and 7 are both not bonded to the GND pins (step S10 of FIG. 3), IC chip becomes a kind D (step S11 of FIG. 3) and then the ID code becomes "1011".

Figure 4:
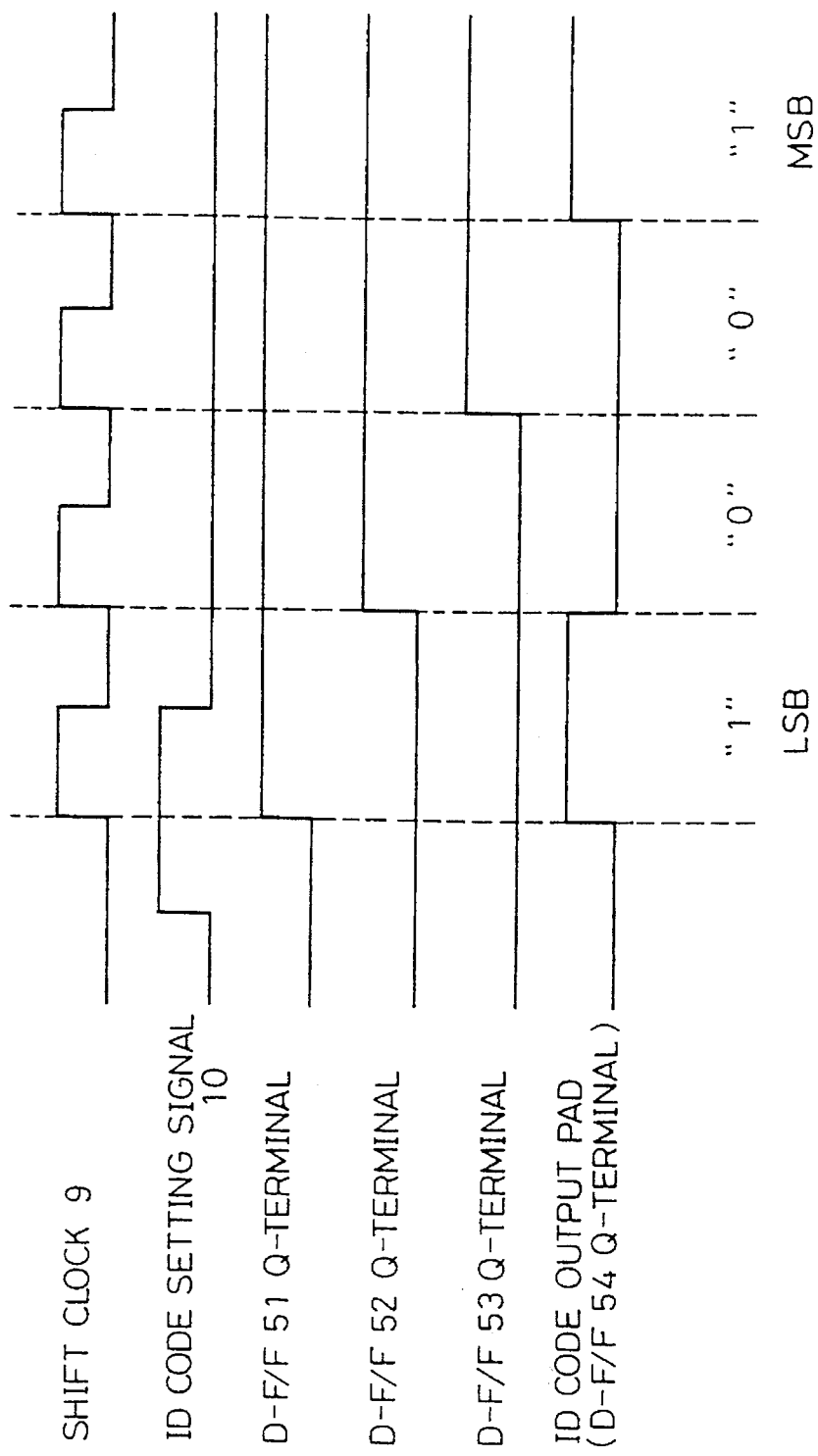
FIG. 4 is a timing chart showing the operation upon outputting of ID code in one embodiment of the semiconductor integrated circuit of the present invention.

FIG. 4 is a timing chart showing operation of one embodiment of the present invention in outputting of the ID code. In FIG. 4, there is illustrated the operation for outputting the ID code "1001" for the kind C, in which only the bonding option pad 7 is bonded to the GND pin. Hereinafter, the ID code output operation will be discussed with reference to FIGS. 2 to 4.

The P-channel transistors 31 and 32 are set at small current capacities to serve as the pull-up resistor for the signal lines 101 and 102 from the bonding option pads 6 and 7 to the function circuit portion 2 and the ID code setting portion 4 by connecting the gates to the GND level.

Accordingly, when both of the bonding option pads 6 and 7 are not bonded to the GND pins, the signal levels 101 and 102 become high level in response to on-set of power supply.

In the kind C, since only the bonding option pad 7 is bonded to the GND pin, the signal line 101 becomes high level while the signal line 102 is held low level.

Here, when the signal for the ID setting pad 10 is turned into high level, the multiplexers 41 to 43 output the levels of A-terminals to the O-terminal. Next, when the shift clock to the shift clock pad 9 is turned into high level, high level is held in the F/F 51, low level is held in the F/F 52, high level held in the F/F 53, low level is held the F/F 54, and then high level is output from the ID code output pad 8.

After turning the signal for the ID code setting pad 10 into low level, when shift clock for three clocks is input to the shift clock pad 9, low level, low level and high level are output in order from the ID code output pad 8.

At this time, by setting so that the ID code is output sequentially in an order from the least significant bit (LSB) to the most significant bit (MSB), the ID code "1001" can be output as the ID code for the kind C.

Similarly, for remaining kinds A, B and D, the ID codes respectively corresponding thereto can be output depending upon whether the bonding option pads 6 and 7 are bonded to the GND pins.

Figure 5:
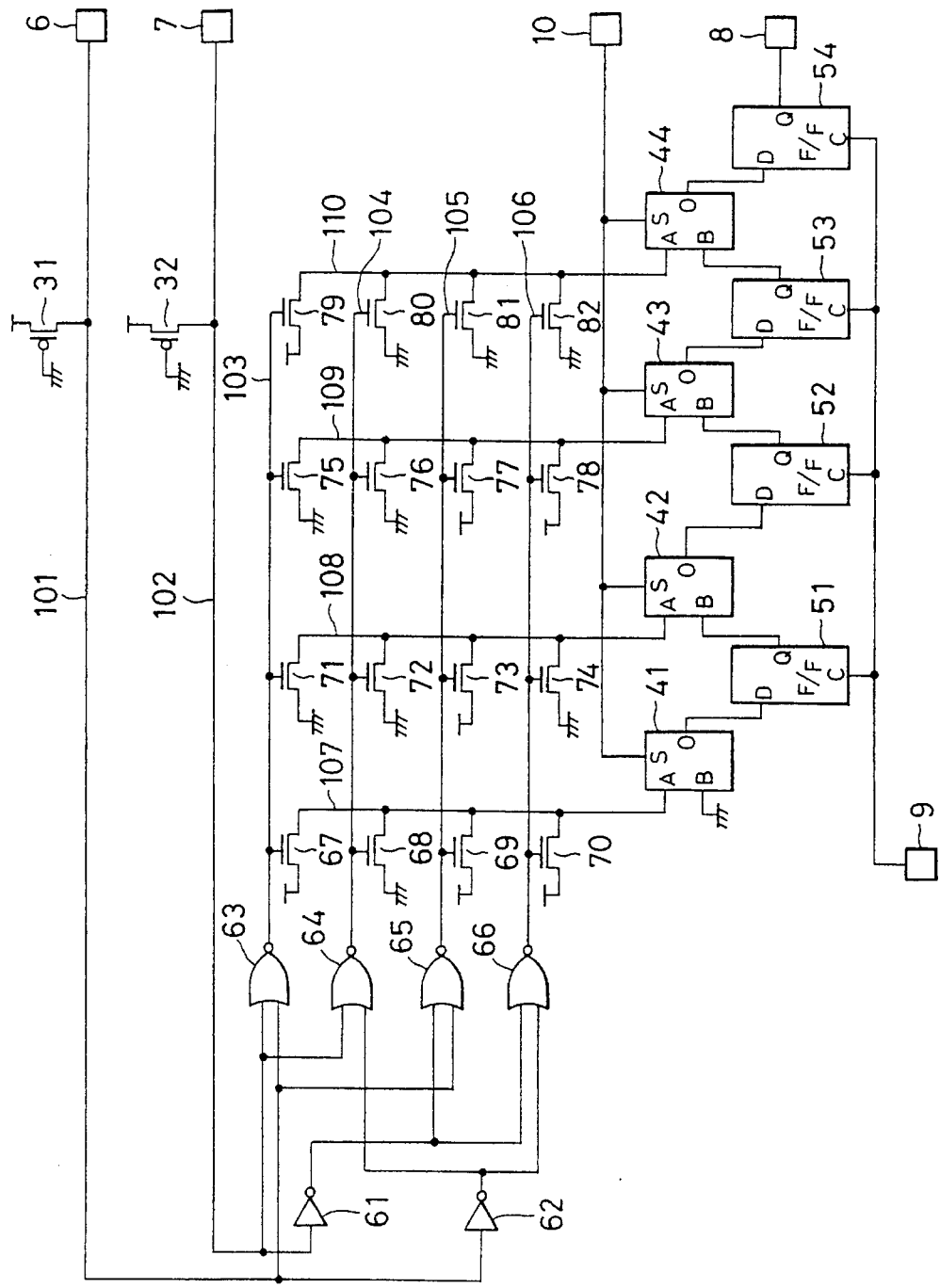
FIG. 5 is an illustration showing in detail and concrete example of a bonding discriminating portion, an ID code setting portion and an ID code register, in another embodiment of the semiconductor integrated circuit according to the invention.

FIG. 5 is an illustration showing the practical detail of the bonding judgement portion and the ID setting portion to be employed in another embodiment of the semiconductor integrated circuit according to the present invention. In FIG. 5, inverters 61 and 62 and NOR gates 63 to 66 forms 2–4 decoders so that any one of the signal lines 103 to 106 becomes high level depending upon the level of the signal lines 101 and 102.

To respective signal lines 103 to 106, gates of N-channel transistors 67 to 82 are connected. The drains of N-channel transistors, 67, 69, 70, 73, 77 to 79 are connected to Vcc level, and whereas the drains of the N-channel transistors 68, 71, 72, 74 to 76 and 82 to 84 are connected to the GND level respectively. Also, the source of the N-channel transistors 67–82 are commonly connected to each of the signal lines 107 to 110.

By this, any one of the signal lines 103 to 106 becomes high level depending upon the level of the signal lines 101 and 102. Any one of the N-channel transistors 67 to 82 having the gate connected to the one of the signal line at high level, turns ON.

Then, the level of the Vcc or the GND level connected to the drains of the N-channel transistors is transferred to the signal lines 107 to 110. Since the signal lines 107 to 110 are respectively input to the A-terminals of the multiplexers 41 to 44, the levels of the signal lines 107 to 110 are set in the F/F's 51 to 54 forming the ID code register 5 in the similar manner. Then, the ID code is output from the ID code output pad 8.

In the above-mentioned another embodiment of the semiconductor device according to the present invention, it is advantageous since the ID codes for the kinds A to D can be applicable even in the case where the ID codes are completely independent from each other.

Figure 6:
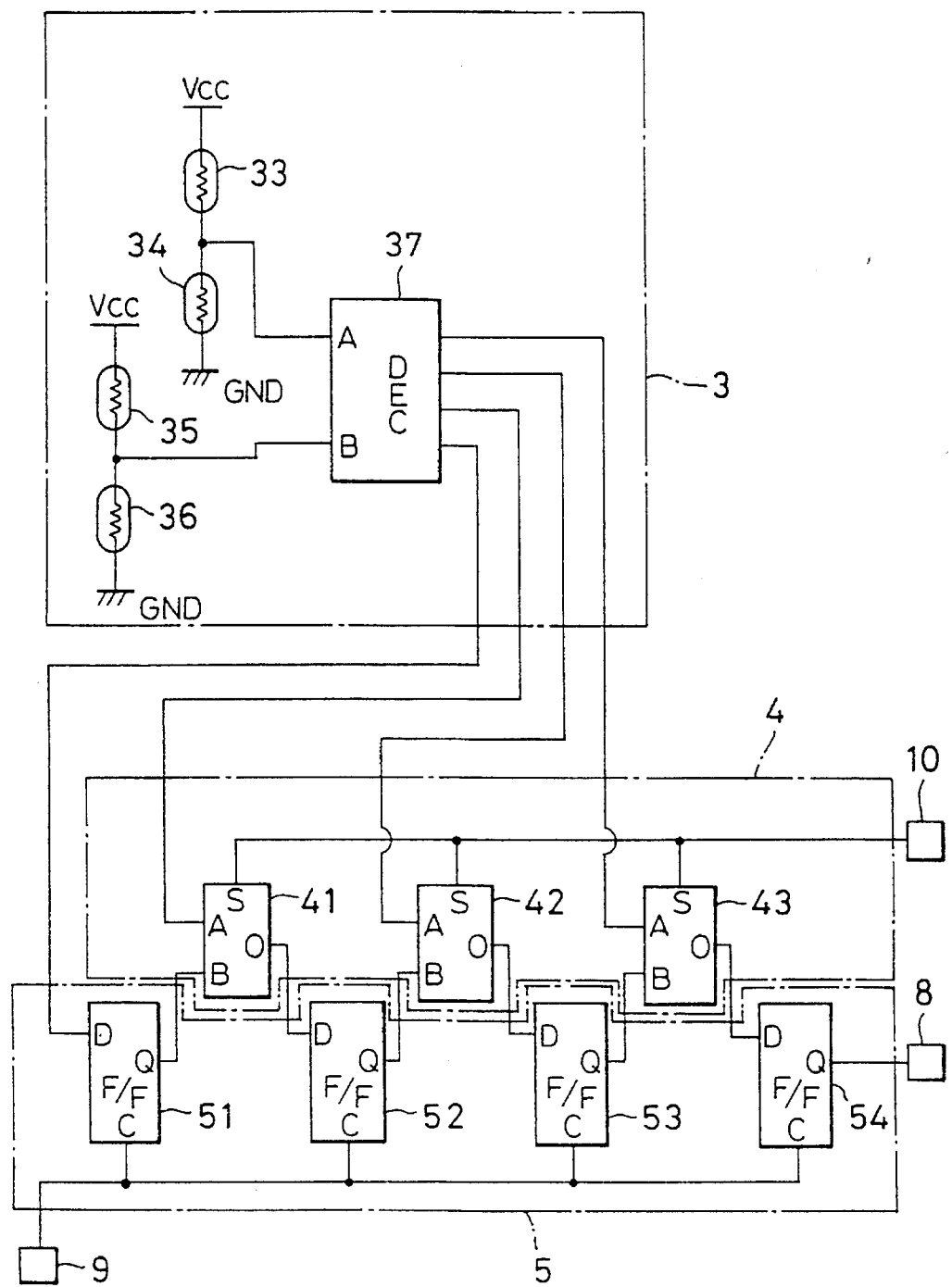
FIG. 6 is an illustration showing the detail and practical example of bonding discriminating portion, an ID code setting portion and an ID code register, in another embodiment of the semiconductor integrated circuit of the present invention.

FIG. 6 is an illustration showing the practical detail of the bonding judgement portion, the ID code setting portion and the ID code register in a further embodiment of the semiconductor integrated circuit according to the present invention. In FIG. 6, the bonding judgement portion 3 comprises fuses 33 to 36 and decoder (DEC) 37.

The fuses 33 and 35 are connected to the power source Vcc at one end, and the fuses 34 to 36 are respectively connected to the grounding line GND. The fuses 33 to 36 are connected mutually at the other ends.

The junction of connection between the other end of the fuses 33 to 36 are connected to the A-terminal and B-terminal of the decoder. The output of the decoder is connected to the D-terminal of the F/F 51 and A-terminals of the multiplexer 41 to 43.

The bonding judgement portion 3 is adapted that the A-terminals and B-terminals of the decoder are connected either to the power supply line Vcc or the grounding line GND by cutting one of the fuses 33 and 35 or the fuses 34 and 36.

Here, discussion will be given for setting of the ID code. It should be noted that when the fuses 33 and 36 are cut, low level is applied to the A-terminal of the decoder 37 and high level is applied to the B-terminal, and thus "1001" is output from the decoder 37.

At first, the signal from the ID code setting pad 10 to the multiplexers 41 to 43 of the ID code setting portion 4 is turned into high level so that the signals to be output from the O-terminals of the multiplexers 41 to 43 to the A-terminals to switch the signal to be input.

Then, to the D-terminal of the F/F 51 of the IC code resister 5, the output "1" is applied from the decoder 37. To the D-terminal of the F/F 52 of the IC code resister 5, the output "0" is applied from the decoder 37. To the D-terminal of the F/F 53 of the IC code resister 5, the output "0" is applied from the decoder 37. To the D-terminal of the F/F 54 of the IC code resister 5, the output "1" is applied from the decoder 37.

Subsequently, the shift clock from the shift clock pad 9 is risen, then "1" is output from the Q-terminal of the F/F 51, "0" is output from the Q-terminal of the F/F 52, "0" is output from the Q-terminal of the F/F 53, and "1" is output from the Q-terminal of the F/F 54. Then, "1" is output from the ID code output pad 8.

After "1" is output from the ID code output pad 8, the signal from the ID code setting pad 10 to the S-terminal of the multiplexers 41 to 43 of the ID setting portion 4 is turned into low level so that the signals to be output from the O terminals of the multiplexers 41 to 43 is switched with the signals input to the B-terminals.

Accordingly, to the D-terminal of the F/F 52 of the ID code register 5, the output "1" from the Q-terminal of the F/F 51 is applied. To the D-terminal of the F/F 53 of the ID code register 5, the output "0" from the Q-terminal of the F/F 52 is applied. To the D-terminal of the F/F 54 of the ID code register 5, the output "0" from the Q-terminal of the F/F 53 is applied.

Subsequently, at the rising of the shift clock from the shift clock pad 9, the F/F's 52 to 54 hold signals applied to the D-terminals. Then, "1" is output from the Q-terminal of the F/F 52, "0" is output from the Q-terminal of the F/F 53, "0" is output from the Q-terminal of the F/F 54. Accordingly, from the ID code output pad 8, "0" is output.

On the other hand, at rising of the next shift clock from the shift clock pad 9, the F/F 53 takes "1" from the Q-terminal of the F/F 52 provided at the D-terminal. The F/F 54 takes "0" from the Q-terminal of the F/F 53 provided at the D-terminal. Therefore, "1" is output from the Q-terminal of the F/F 53 and "0" is output from the Q-terminal of the F/F 54. Therefore, "0" is output from the ID code output pad 8.

Furthermore, at the rising of the next shift clock, the F/F 54 takes "1" from the Q-terminal of the F/F 53 provided at the D-terminal. Then, from the Q-terminal of the F/F 54, "1" is output. Therefore, "1" is output from the ID code output pad 8.

By the operation set forth above, by setting so that the ID code is output sequentially in an order from the least significant bit (LSB) to the most significant bit (MSB), the ID code "1001" can be output from the ID code output pad 8 at third rising of the shift clock from the shift clock pad 9.

In another embodiment of the present invention, the foregoing discussion has been given for the case of outputting "1001" from the decoder by cutting the fuses 33 and 36, another four bits ID code can be selectively output by selectively cutting the fuses 33 to 36.

On the other hand, by using the bonding judgement portion 3 as level judgement portion, the foregoing another embodiment of the present invention can be applied for setting of the identification code for the derivative products, for which the grade of the wafer is selected by P/W selection after diffusion process.

Figure 7:
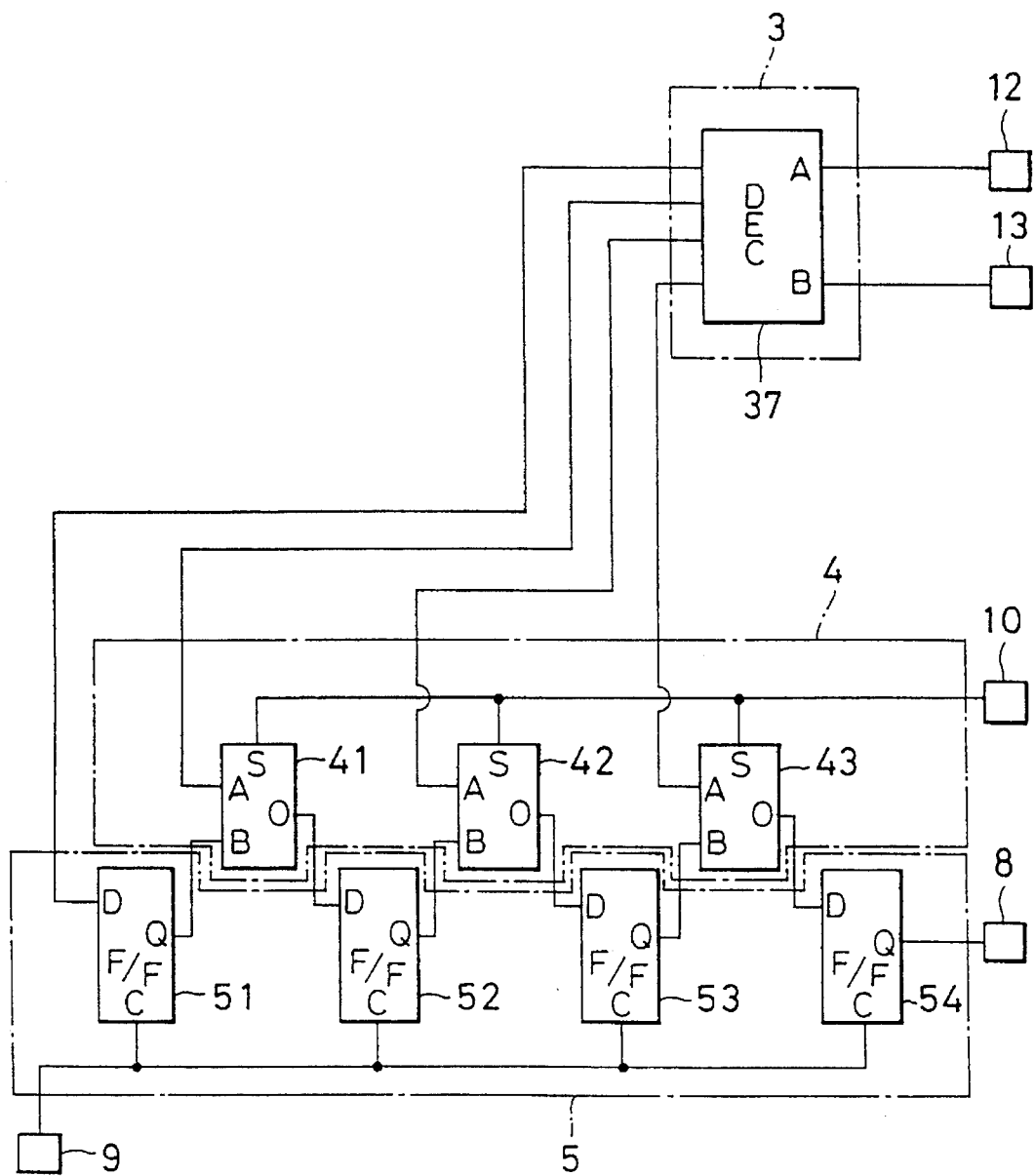
FIG. 7 is an illustration showing the detail and practical example of bonding discriminating portion, an ID code setting portion and an ID code register, in another embodiment of the semiconductor integrated circuit of the present invention.
Figure 8:
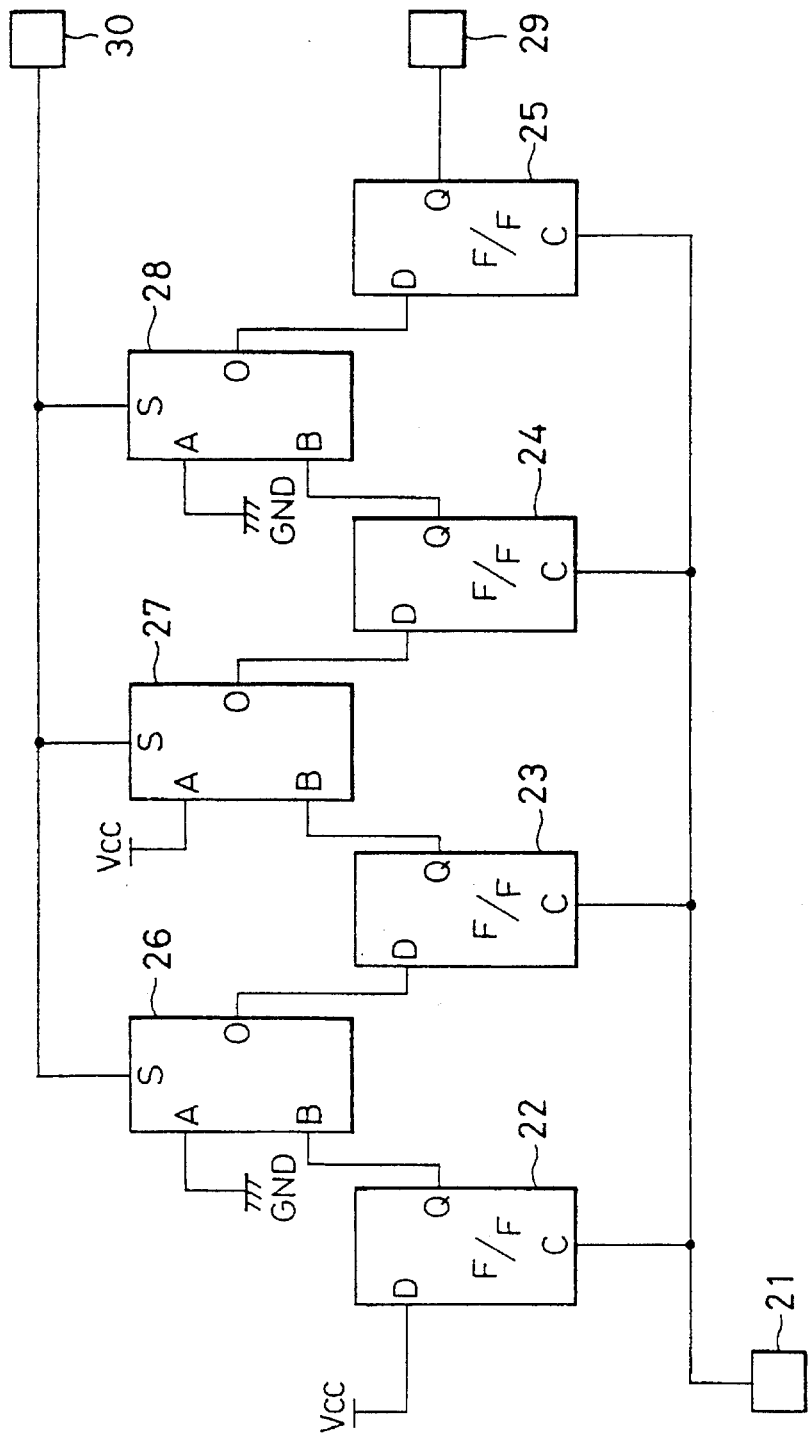
FIG. 8 is an illustration showing the detail and practical example of bonding discriminating portion, an ID code setting portion and an ID code register, in the prior art.
Figure 9:
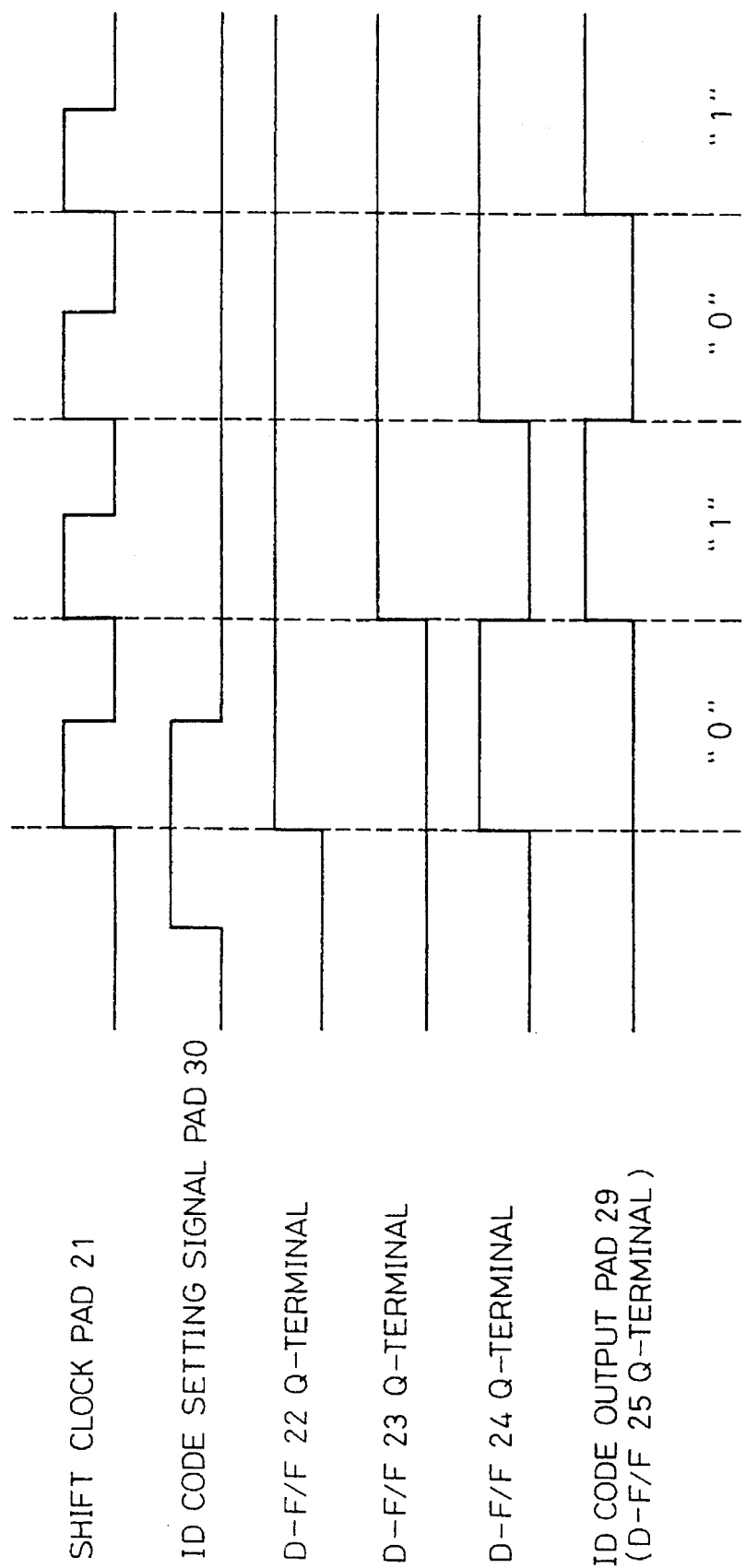
FIG. 9 is a timing chart showing the operation upon outputting of the ID code in the prior art.
Figure 10:
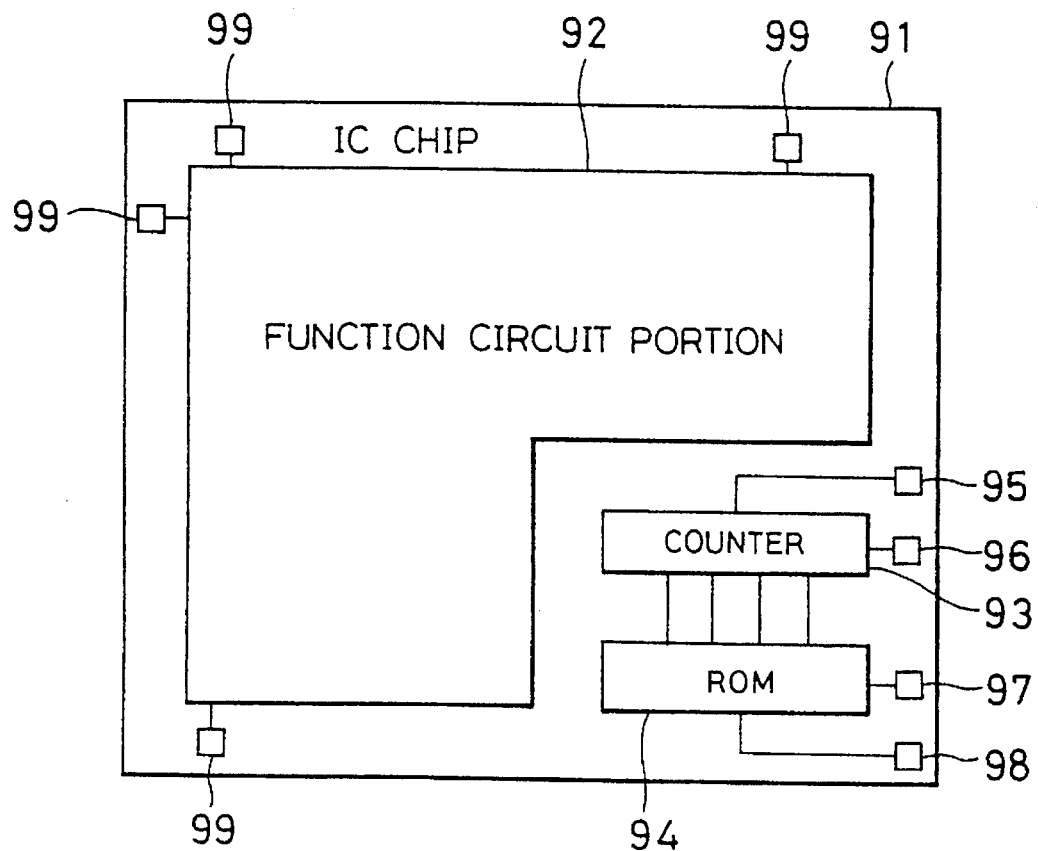
FIG. 10 is an illustration showing the construction of the prior art.
Figure 11:
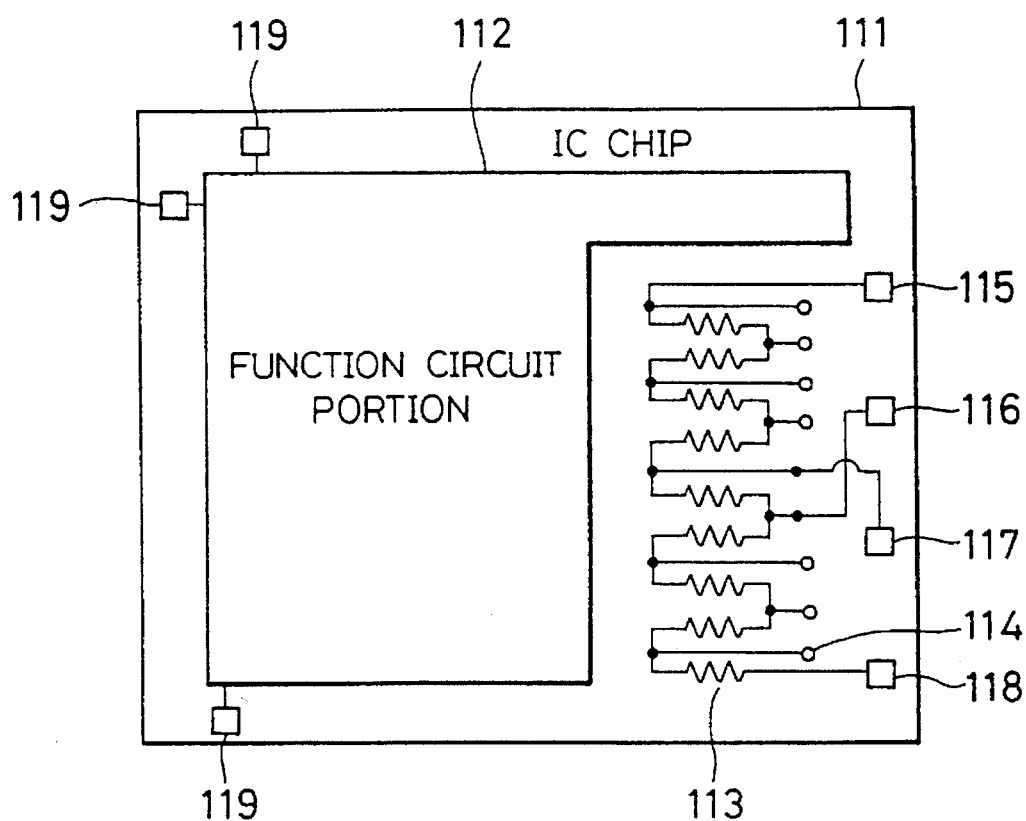
FIG. 11 is an illustration showing the construction of the prior art.

FIG. 7 is an illustration showing the practical detail of the bonding judgement portion, the ID code setting portion and the ID register in a still further embodiment of the present invention. In FIG. 7, the bonding judgement portion 3 comprises a decoder (DEC) 37.

The input signal pad 12 is connected to the A-terminal of the decoder 37 and the input signal pad 13 is connected to the B-terminal of the decoder 37. The output of the decoder 37 is connected to the D-terminal of the F/F 51 and the A-terminals of the multiplexers 41 to 43, respectively.

In the still embodiment of the present invention, the decoder is adapted to output the ID code depending upon the levels of the signals input to the input signal pads 12 and 13 so that the ID code of the product name and so forth can be set by the levels of the signals to be input to the input signal pads 12 and 13.

Here, discussion will be given for setting of the ID code. It is assumed that when low level is applied to the input signal pad 12 and high level is applied to the input signal pad 13, "1001" is output from the decoder 37.

At first, the signals from the ID code setting pad 10 to the S-terminals of the multiplexer 41 to 43 of the ID code setting portion 4 are turned into high level to switch the signals to be output from the O-terminals of the multiplexers 41 to 43 to the signals input to the A-terminals.

Then, to the D-terminal of the F/F 51 of the ID code register 5, the output "1" from the decoder is applied. To the D-terminal of the F/F 52 of the ID code register 5, the output "0" from the decoder is applied via the multiplexer 41. Also, to the D-terminal of the F/F 53 of the ID code register 5, the output "0" from the decoder is applied via multiplexer 42. To the D-terminal of the F/F 54 of the ID code register 5, the output "1" from the decoder is applied via multiplexer 43.

Subsequently, at the rising of the shift clock from the shift clock pad 9, the signals applied to the D-terminals of respective F/F 51 to 54 are held in respective F/F 51 to 54. Then, "1" is output from the Q-terminal of the F/F 51, "0" is output from the Q-terminal of the F/F 52, "0" is output from the Q-terminal of the F/F 53 and "1" is output from the Q-terminal of the F/F 54. Accordingly, from the ID code output pad 8, "1" is output.

After the timing where "1" is output from the ID code output pad 8, the signals for the S-terminals of the multiplexers 41 to 43 of the ID code setting portion 4 from the ID code setting pad 10 are turned into low level to switch the signal to be output from the O-terminals of the multiplexers 41 to 43 to the signals input to the D-terminals.

Accordingly, to the D-terminal of the F/F 52 of the output ID code register 5, the output "1" from the Q-terminal of the F/F 51 is applied. To the D-terminal of the F/F 53 of the ID code register 5, the output "0" from the Q-terminal of the F/F 52 is applied. To the D-terminal of the F/F 54 of the ID code register 5, the output "0" from the Q-terminal of the F/F 53 is applied.

On the other hand, at rising of the next shift clock from the shift clock pad 9, The F/F 53 takes "1" from the Q-terminal of the F/F 52 provided at the D-terminal. The F/F 54 takes "0" from the Q-terminal of the F/F 53 provided at the D-terminal. Therefore, "1" is output from the Q-terminal of F/F 53 and "0" is output from the Q-terminal of the F/F 54. Therefore, "0" is output from the ID code output pad 8.

Furthermore, at the rising of the next shift clock, the F/F 54 takes "1" from the Q-terminal of the F/F 53 provided at the D-terminal. Then, from the Q-terminal of the F/F 54, "1" is output. Therefore, "1" is output from the ID code output pad 8.

By the operation set forth above, by setting so that the ID code is output sequentially in an order from the least significant bit (LSB) to the most significant bit (MSB), the ID code "1001" can be output from the ID code output pad 8 at a third rising of the shift clock from the shift clock pad 9.

In the foregoing embodiment of the present invention, discussion has been given for the case where "1001" is output from the decoder by inputting low level and high level respectively to the input signal pads 12 and 13. However, other four bits ID codes can be selectively output by varying the combination of the input signal levels for the input signal pads 12 and 13.

Also, by using the bonding judgement portion 3 as a level judgement portion, the foregoing another embodiment of the present invention can be applied for setting of the identification code for the derivative products, for which the grade of the wafer is selected by P/W selection after diffusion process.

Furthermore, by varying the ID code set in the ID code register with the output from the decoder depending upon cutting of the fuses 33 to 36 or setting of the levels of the signals applied to the input signal pads, it becomes possible to vary the ID code or the product name by the fuse option or the input signal levels.

Therefore, it becomes possible to set the identification code for the bonding option parts, for which the kind is determined in the assembling process or the derivative products, grade of the wafer is selected in the P/W selection after the diffusion process.

For instance, for the semiconductor integrated circuit installing a boundary scanning test circuit standardized by IEEE 1149.1 for making an on-board installation test efficient, it is required to set the ID code as identification code corresponding to kind name on a one by one basis, the present invention is applicable for such semiconductor integrated circuit for which the kind name is determined in the assembling process.

Although the invention has been illustrated and described with respect to exemplary embodiments thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodied within a scope encompassed and equivalents thereof with respect to the features set out in the appended claims.

What is claimed is:

1. A semiconductor integrated circuit comprising:

a plurality of bonding pads, each bonding pad being supplied with a voltage for setting an identification code indicative of a kind of said semiconductor integrated circuit, judgement means for making a judgement for a combination pattern of voltage levels of said bonding pads, and holding means for holding a result of said judgement by said judgement means as said identification code.

2. A semiconductor integrated circuit as set forth in claim 1, wherein each of said bonding pads is bonded to a predetermined voltage line corresponding to said kind of said semiconductor integrated circuit.

3. A semiconductor integrated circuit as set forth in claim 2, wherein said judgement means comprises a decoder for decoding said combination pattern of voltage levels of said bonding pads.

4. A semiconductor integrated circuit as set forth in claim 3, further comprising:

a plurality of pull-up means for pulling-up potentials of said bonding pads to a power source voltage, respectively, and a plurality of bonding lines for connecting selectively said bonding pads to the ground voltage line, corresponding to said kind of said semiconductor integrated circuit.

5. A semiconductor integrated circuit as set forth in claim 4, wherein said holding means includes a shift register comprising a plurality of flip-flop elements and said flip-flop elements hold said result of said judgement by said judgement means as said identification code.

6. A semiconductor integrated circuit as set forth in claim 5, wherein a content of said shift register is read out by a shifting operation.

7. A semiconductor integrated circuit comprises:

a voltage generator circuit for generating N voltages, N being an integer larger than 1, for setting an identification code indicative of a kind of said semiconductor integrated circuit, said voltage generator circuit having N voltage output terminals corresponding to said voltages, pull-up fuses connected between said voltage output terminals and a power supply voltage, respectively, and pull-down fuses connected between said voltage output terminals and a reference voltage, respectively, said fuses being selectively cut corresponding to said kind of said semiconductor integrated circuit, judgement means for making a judgement for a combination pattern in number of $2^N$ of said voltages at said voltage output terminals, and holding means for holding a result of said judgement in number of $2^N$ by said judgement means as said identification code.

8. A semiconductor integrated circuit as set forth in claim 7, wherein said judgement means comprises a decoder for decoding said combination pattern of said voltages generated at said voltage output terminals.

9. A semiconductor integrated circuit as set forth in claim 8, wherein said holding means includes a shift register comprising a plurality of flip-flop elements and said plurality of flip-flop elements hold said result of said judgement by said judgement means as said identification code.

10. A semiconductor integrated circuit as set forth in claim 9, wherein a content of said shift register is read out by a shifting operation.

* * * * *